(12) United States Patent
Breil et al.

(10) Patent No.: US 10,096,609 B2
(45) Date of Patent: Oct. 9, 2018

(54) MODIFIED TUNGSTEN SILICON

(71) Applicant: GLOBALFOUNDRIES INC., Grand Cayman (KY)

(72) Inventors: Nicolas L. Breil, Beacon, NY (US); Domingo A. Ferrer, Fishkill, NY (US); Keith Kwong Hon Wong, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 10 days.

(21) Appl. No.: 14/622,997

(22) Filed: Feb. 16, 2015

(65) Prior Publication Data

US 2016/0240438 A1 Aug. 18, 2016

(51) Int. Cl.
*H01L 23/525* (2006.01)
*H01L 27/112* (2006.01)
*H01L 23/522* (2006.01)
*H01L 23/532* (2006.01)
*H01L 21/768* (2006.01)

(52) U.S. Cl.
CPC .... *H01L 27/11206* (2013.01); *H01L 23/5228* (2013.01); *H01L 23/5256* (2013.01); *H01L 21/76886* (2013.01); *H01L 23/53261* (2013.01)

(58) Field of Classification Search
None
See application file for complete search history.

(56) References Cited

U.S. PATENT DOCUMENTS

| 4,579,600 | A | | 4/1986 | Shah et al. | |
|---|---|---|---|---|---|
| 4,703,557 | A | | 11/1987 | Nespor et al. | |
| 5,130,266 | A | * | 7/1992 | Huang | H01L 21/28061 |
| | | | | | 148/DIG. 147 |
| 5,635,893 | A | * | 6/1997 | Spraggins | G01K 7/22 |
| | | | | | 219/209 |
| 6,191,018 | B1 | | 2/2001 | Yue et al. | |
| 6,221,762 | B1 | * | 4/2001 | Byun | H01L 21/28518 |
| | | | | | 257/E21.165 |
| 6,440,848 | B1 | * | 8/2002 | Hong | H01L 21/76838 |
| | | | | | 257/E21.582 |
| 6,642,112 | B1 | * | 11/2003 | Lowe | H01L 21/82384 |
| | | | | | 257/E21.637 |
| 7,316,960 | B2 | | 1/2008 | Ting | |
| 7,666,790 | B2 | | 2/2010 | Luo et al. | |
| 7,799,628 | B2 | | 9/2010 | Liu et al. | |
| 7,812,401 | B2 | | 10/2010 | Obradovic et al. | |
| 7,919,373 | B2 | | 4/2011 | Lee et al. | |
| 8,618,610 | B2 | | 12/2013 | Wang et al. | |
| 8,748,256 | B2 | | 6/2014 | Zhao et al. | |
| 2002/0162500 | A1 | * | 11/2002 | Hong | C23C 16/42 |
| | | | | | 117/3 |
| 2007/0120218 | A1 | * | 5/2007 | Hsu | H01L 23/5256 |
| | | | | | 257/529 |

(Continued)

FOREIGN PATENT DOCUMENTS

| JP | 11-260933 A | 9/1999 |
|---|---|---|
| JP | 2008-300642 A | 12/2008 |

*Primary Examiner* — Abul Kalam
(74) *Attorney, Agent, or Firm* — Yuanmin Cai; Hoffman Warnick LLC

(57) ABSTRACT

A method for forming a precision resistor or an e-fuse structure where tungsten silicon is used. The tungsten silicon layer is modified by changing the crystalline structure to a tetragonal tungsten silicon layer.

18 Claims, 3 Drawing Sheets

(56) References Cited

U.S. PATENT DOCUMENTS

| | | |
|---|---|---|
| 2012/0252180 A1 | 10/2012 | Tomimatsu et al. |
| 2013/0149849 A1 | 6/2013 | Nandakumar |
| 2014/0106538 A1 | 4/2014 | Wang et al. |
| 2014/0191367 A1* | 7/2014 | Xiao ........................ H01L 28/20 257/537 |
| 2015/0162330 A1* | 6/2015 | Lin ..................... H01L 27/0886 257/401 |

* cited by examiner

MODIFIED TUNGSTEN SILICON

BACKGROUND

The present invention relates to semiconductor devices, and particularly to forming e-fuse and precision resistor structures.

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and efuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a stripe (commonly also called a "link") of conducting material (metal, poly-silicon, etc.) between two pads, generally referred to as anode and cathode. Applying a fuse current ($I_{FUSE}$) to the E-fuse destroys the link, thus changing the resistance of the E-fuse. This is commonly referred to as "programming" the E-fuse. The fuse state (i.e., whether it has been programmed) can be read using a sense circuit, which is common in the art of electronic memories.

BRIEF SUMMARY

An embodiment of the invention may include a method of forming a semiconductor structure. The method may include forming a tungsten silicon layer on an insulator. The tungsten silicon layer may be converted to a tetragonal phase tungsten silicon layer. A first conductive material and a second conductive material on the tungsten silicon layer may be formed. The first conductive material and the second conductive material may be electrically insulated from each other, except for the tetragonal phase silicon layer that forms an electrical connection between the first conductive material and the second conductive material.

Another embodiment of the invention may include a method of forming a semiconductor structure. The method may include forming a tungsten silicon layer on an insulator. The tungsten silicon layer may have a ratio of silicon to tungsten of about 2.7. The tungsten silicon layer may be converted to a tetragonal phase tungsten silicon layer. A first conductive material and a second conductive material on the tungsten silicon layer may be formed. The first conductive material and the second conductive material may be electrically insulated from each other, except for the tetragonal phase silicon layer that forms an electrical connection between the first conductive material and the second conductive material.

Another embodiment of the invention may include a semiconductor structure. The semiconductor structure may include an insulator and a tetragonal phase tungsten silicon layer on the Mx layer. There may be a first conductive material contacting a first region of the tetragonal phase tungsten silicon layer and a second conductive material contacting a second region of the tetragonal phase tungsten silicon layer. The tetragonal phase tungsten silicon layer may form an electrical connection between the first conductive material and the second conductive material.

BRIEF DESCRIPTION OF THE SEVERAL DRAWINGS

Figure 1:
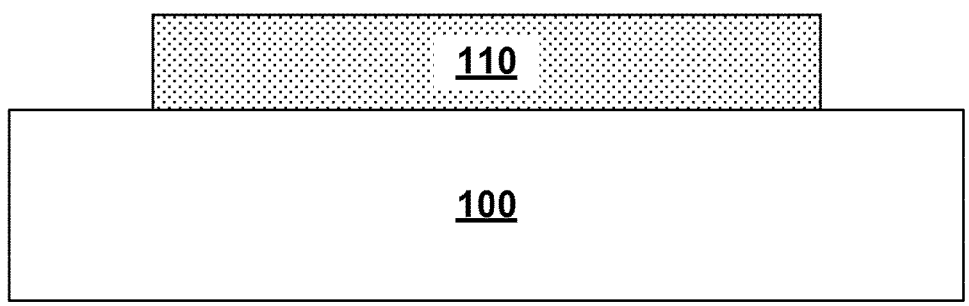
FIG. 1 is a cross-sectional view of a semiconductor structure containing a tungsten silicon layer deposited on a substrate, according to an embodiment of the invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Tungsten silicon may be an effective material in creating precision resistors or eFuse structures for semiconductor chips. In some instances, deposition of a tungsten silicon layer 110 may create a layer having a formula of $WSi_x$. In order to create more efficient chips, resistance and $T_{CR}$ (Temperature coefficient of Resistance) may be lowered by modifying the composition and stoichiometry of the tungsten silicon alloy after or during deposition. A lower TCR enables a higher uniformity for the chips manufactured in the wafer. Lower resistance allows lower voltage needed for programming the efuse elements.

Referring to FIG. 1, a tungsten silicon layer 110, for use in semiconductor devices, may be created by depositing tungsten silicon on an $M_x$ layer 100. The resulting tungsten silicon layer 110 may have a chemical formula of $WSi_x$, where the ratio of silicon located in the crystal lattice of the structure is 2.2 to 3.0 that of tungsten, more preferably 2.6 to 2.8 that of tungsten, even more preferably 2.7 that of tungsten. The deposition of the tungsten silicon layer 110 may be performed using any suitable method in the art such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition, the thickness of the tungsten silicon layer 110 may be 10 to 20 nm. The tungsten silicon layer 110 may be deposited on $M_x$ layer 100, wherein the $M_x$ layer 100 may be any suitable material, such as, for example, conductors, insulators, or combinations thereof. In an example embodiment, the $M_x$ layer 100 may be an insulator such as, for example, metal oxides, metal nitrides or metal oxynitrides. In other embodiments, the Mx layer 100 may have a combination of insulator layers and conductive layers. In such embodiments, the conductive metal may be, for example, copper, aluminum, tungsten or combinations thereof.

Figure 2:
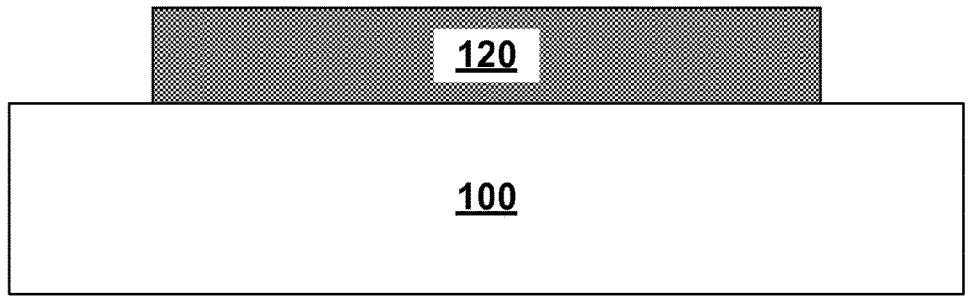
FIG. 2 is a cross-sectional view the semiconductor structure following introduction of nitrogen into the tungsten silicon layer, according to an embodiment of the invention.

Referring to FIG. 2, following the deposition of the tungsten silicon layer 110, a thermal anneal in ambient or controlled atmosphere in argon, helium, nitrogen, or combination may be performed to change the crystalline structure of the tungsten silicon layer 110, forming a tetragonal phase tungsten silicon layer 120. Prior to the anneal, the tungsten silicon layer 110 may have an amorphous or hexagonal crystalline structure. This may decrease the resistance and $T_{CR}$ of the resulting tungsten silicon layer 120 by over 50%, and as much as 25 times, of the value of the tungsten silicon layer 110, due to changes in the crystalline structure. This may also decrease the resistance of the tungsten silicon layer 120 by at least 5%, and as much as 20%. The thermal anneal may be any number of processes that may change the crystalline structure of the tungsten silicon layer 110 such as, for example, a rapid thermal annealing process, a furnace annealing process, a laser anneal, a spike anneal or any other like annealing process that is capable of converting the amorphous tungsten silicon layer 110 into the tetragonal phase tungsten silicon layer 120. In an embodiment, a laser spike anneal (LSA) may be performed. In such embodiments, the LSA may be performed at temperatures ranging from approximately 900 to approximately 1150° C., more preferably from approximately 1050 to approximately 1100° C., for a period of time from approximately 0.1 to approximately 10 milliseconds.

Figure 3:
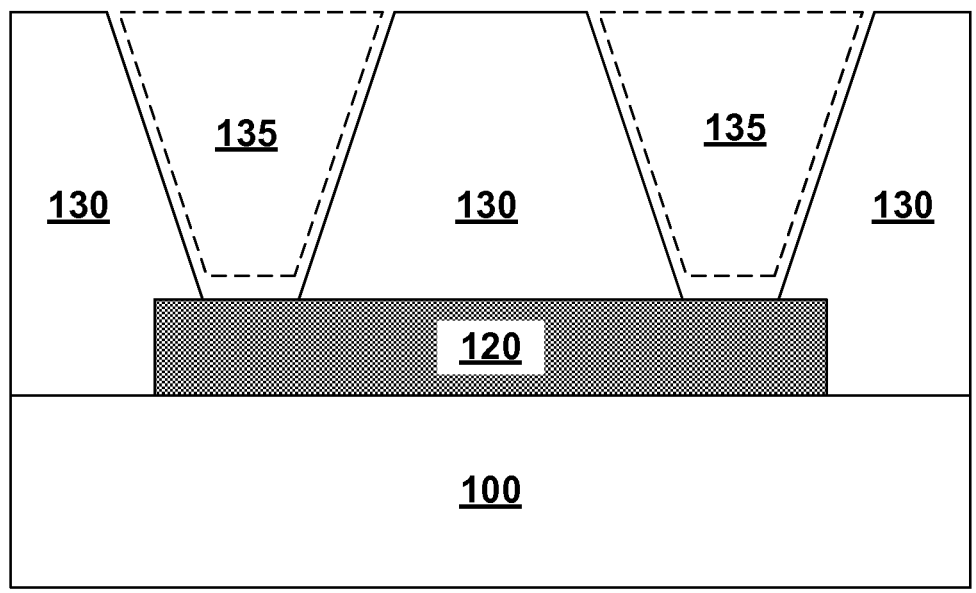
FIG. 3 is a cross-sectional view of the semiconductor structure following deposition of an insulator and creation of damascene voids, according to an embodiment of the invention.

With reference to FIG. 3, an $M_{x+1}$ dielectric 130 may be deposited over the structure, and subsequent damascene or dual damascene structures may be created. The $M_{x+1}$ dielectric 130 may electrically insulate the tetragonal phase tungsten silicon layer 120 from additional interconnect levels (not shown) that may be subsequently formed above the tetragonal phase tungsten silicon layer 120. The $M_{x+1}$ dielectric 130 may be deposited using typical deposition techniques, for example, chemical vapor deposition. The $M_{x+1}$ dielectric 130 may include any suitable dielectric material, for example, silicon nitride ($Si_3N_4$), silicon carbide (SiC), silicon carbon nitride (SiCN), hydrogenated silicon carbide (SiCH), or other known capping materials. The $M_{x+1}$ dielectric 130 may have a thickness ranging from about 20 nm to about 60 nm and ranges there between, although a thickness less than 20 nm and greater than 60 nm may be acceptable.

Still referring to FIG. 3, a damascene opening 135 may be formed in the $M_{x+1}$ dielectric 130. The damascene opening 135 may include a trench opening and two via openings. The damascene opening 135 may be formed using any suitable masking and etching technique known in the art. In one embodiment, a dry etching technique using a fluorine based etchant, such as, for example $C_xF_y$, may be used. In one embodiment, the depth of the trench opening may range from about 50 nm to about 100 nm. Also, the via openings may extend vertically from the bottom of the trench opening down to the top of the first and second $M_x$ metals 206, 208.

Figure 4:
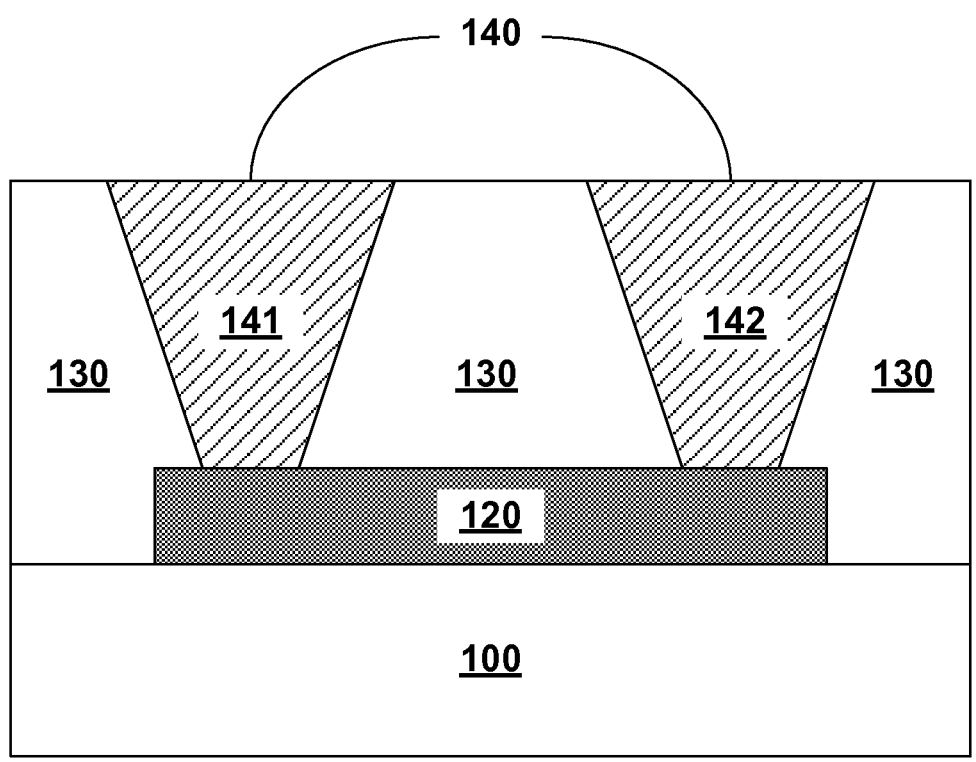
FIG. 4 is a cross-sectional view of the semiconductor structure following formation of conductive contacts in the damascene voids, according to an embodiment of the invention.

Referring now to FIG. 4, a set of conductive interconnects 140, containing a first conductive interconnect 141 and a second conductive interconnect 142, may be formed within the damascene opening 135. The set of conductive interconnects 140 may contain a liner and a metal fill may be deposited in via recess. The liner may be made of, for example, tantalum or tantalum nitride, or titanium and titanium nitride, as adhesion layer for subsequent tungsten deposition, and may include one or more layers of liner material. The metal fill may include, for example, copper, aluminum, or tungsten. The liner and metal fill may be formed using a filing technique such as electroplating, electroless plating, chemical vapor deposition, physical vapor deposition or a combination of methods. Following the creation of the set of conductive interconnects 140, the tetragonal phase tungsten silicon layer 120 forms an electrical connection from the first conductive interconnect 141 to the second conductive interconnect 142, and may be used as an e-fuse or precision resistor as part of a semiconductor device.

Figure 5:
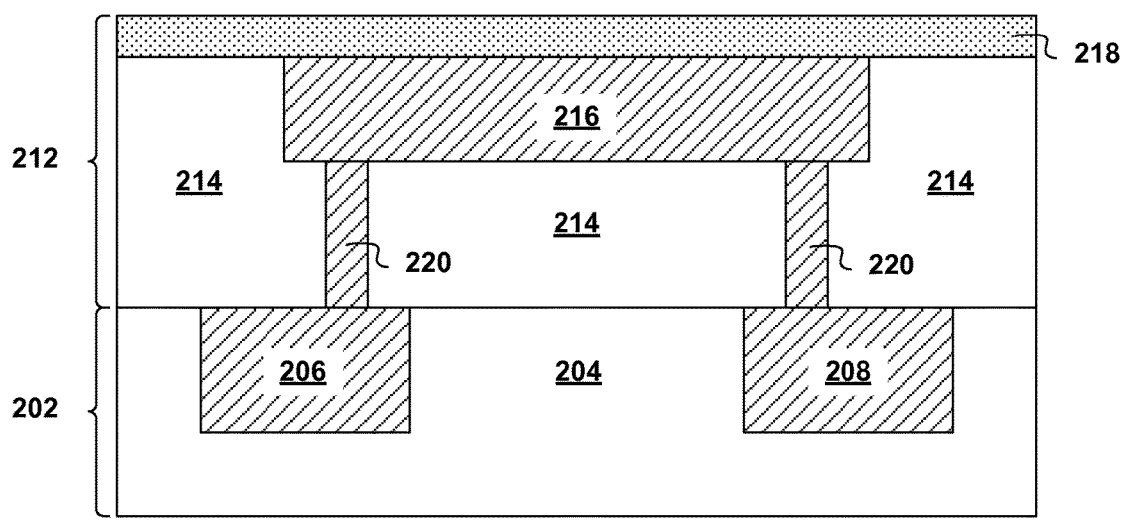
FIG. 5 is a cross-sectional view of an alternative semiconductor structure, according to an embodiment of the invention.

In additional embodiments an e-fuse structure depicted in FIG. 5 may be used. The e-fuse may include an $M_x$ level 202 and an $M_{x+1}$ level 212. The $M_x$ level 202 may include an $M_x$ dielectric 204 and two $M_x$ metals 206, 208. The $M_{x+1}$ level 212 may include an $M_{x+1}$ dielectric 214, a tetragonal phase tungsten silicon layer 216, and two vias 220. In such embodiments, the tetragonal phase tungsten silicon layer 216 may be the tetragonal phase tungsten silicon layer formed using the process steps listed above. An $M_{x+1}$ cap dielectric 218 may be located above the $M_{x+1}$ dielectric 214 and electrically insulate the $M_{x+1}$ level 212 from additional interconnect levels (not shown) that may be subsequently formed above. The vias 220 may electrically connect the fuse line 216 to the $M_x$ metals 206, 208. The $M_x$ metals 206, 208, the vias 220, and the tetragonal phase tungsten silicon layer 216 make up the e-fuse.

In either embodiment, a resultant structure is formed in which a low resistivity tetragonal phase tungsten silicon layer forms an electrical connection between two conductive regions. The two conductive regions may be vias, or lines, and may be made of a conductive material such as, for example, copper, tungsten or aluminum. The conductive regions may be electrically isolated from one another using a dielectric material, such that the only path for electric current to move from the first conductive region to the second conductive region is through the tetragonal phase tungsten silicon layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    forming a single amorphous tungsten silicon layer directly on an insulator, wherein the single amorphous tungsten silicon layer comprises tungsten and silicon, and wherein the single amorphous tungsten silicon layer has a substantially amorphous structure;
    converting the single amorphous tungsten silicon layer to a tetragonal phase tungsten silicon layer by performing a laser spike anneal of the single amorphous tungsten silicon layer, wherein the tetragonal phase tungsten silicon layer has a tetragonal crystalline structure, and wherein the converting the single amorphous tungsten silicon layer to the tetragonal phase tungsten silicon layer includes reducing a resistance of the single amorphous tungsten silicon layer; and
    after converting the single amorphous tungsten silicon layer to a tetragonal phase tungsten silicon layer, forming a first conductive material and a second conductive material on the tetragonal phase tungsten silicon layer, wherein the tetragonal phase tungsten silicon layer forms an electrical connection between the first conductive material and the second conductive material, and
    wherein the tetragonal phase tungsten silicon layer directly contacts the first conductive material and wherein the tetragonal phase tungsten silicon layer directly contacts the second conductive material.

2. The method of claim 1, wherein the single amorphous tungsten silicon layer has a molar ratio of silicon to tungsten in the range of about 2.2 to about 3.0.

3. The method of claim 1, wherein the single amorphous tungsten silicon layer has a molar ratio of silicon to tungsten in the range of about 2.6 to about 2.8.

4. The method of claim 1, wherein the single amorphous tungsten silicon layer has a molar ratio of silicon to tungsten of about 2.7.

5. The method of claim 1, wherein the laser spike anneal is performed at a temperature ranging from about 900 to about 1150° C.

6. The method of claim 1, wherein converting the single amorphous tungsten silicon layer to a tetragonal phase tungsten silicon layer comprises causing a reduction in a temperature coefficient of resistance of the single amorphous tungsten silicon layer.

7. The method of claim 1, wherein the laser spike anneal is performed for a time period ranging from approximately 0.1 milliseconds to approximately 10 milliseconds.

8. The method of claim 1, wherein the causing the reduction in the resistance of the single amorphous tungsten silicon layer includes decreasing the resistance of the single amorphous tungsten silicon layer by approximately at least 5%.

9. The method of claim 1, wherein the causing the reduction in the resistance of the single amorphous tungsten silicon layer includes decreasing the resistance of the single amorphous tungsten silicon layer by approximately over 50%.

10. The method of claim 1, wherein a thickness of the tetragonal phase tungsten silicon layer is approximately 10 nanometers (nm) to approximately 20 nm.

11. The method of claim 1, wherein the tetragonal phase tungsten silicon layer, the first conductive material, and the second conductive material form a precision resistor.

12. A method of forming a semiconductor structure, the method comprising:
    forming a single tungsten silicon layer directly on an insulator, wherein the single tungsten silicon layer comprises tungsten and silicon;
    performing a laser spike anneal at a temperature ranging from about 900 to about 1150° C. on the single tungsten silicon layer to cause a reduction in resistance of the tungsten silicon layer; and
    forming an e-fuse structure including the single tungsten silicon layer.

13. The method of claim 12, wherein the single tungsten silicon layer has a molar ratio of silicon to tungsten in the range of about 2.2 to about 3.0.

14. The method of claim 12, wherein the single tungsten silicon layer has a molar ratio of silicon to tungsten in the range of about 2.6 to about 2.8.

15. The method of claim 12, wherein the single tungsten silicon layer has a substantially amorphous structure or a hexagonal structure.

16. The method of claim 12, wherein performing the laser spike anneal comprises converting a crystalline structure of the single tungsten silicon layer to a tetragonal crystalline structure.

17. The method of claim 12, wherein performing the laser spike anneal comprises causing a reduction in a temperature coefficient of resistance of the single tungsten silicon layer.

18. The method of claim 12, wherein the forming the efuse structure includes, after performing the laser spike anneal, forming a first conductive material and a second conductive material on the single tungsten silicon layer, wherein the single tungsten silicon layer forms an electrical connection between the first conductive material and the second conductive material.

* * * * *